United States Patent
Li et al.

(10) Patent No.: US 10,453,909 B2
(45) Date of Patent: Oct. 22, 2019

(54) OLED ARRAY SUBSTRATE WITH OVERLAPPED CONDUCTIVE LAYER AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Yongqian Li, Beijing (CN); Pan Xu, Beijing (CN); Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/570,615

(22) PCT Filed: May 25, 2017

(86) PCT No.: PCT/CN2017/085921
§ 371 (c)(1),
(2) Date: Oct. 30, 2017

(87) PCT Pub. No.: WO2017/206796
PCT Pub. Date: Dec. 7, 2017

(65) Prior Publication Data
US 2018/0261663 A1    Sep. 13, 2018

(30) Foreign Application Priority Data
May 30, 2016    (CN) .......................... 2016 1 0371658

(51) Int. Cl.
*H01L 27/32*    (2006.01)
*H01L 21/77*    (2017.01)
(Continued)

(52) U.S. Cl.
CPC ....... *H01L 27/3276* (2013.01); *G09G 3/3225* (2013.01); *H01L 21/77* (2013.01);
(Continued)

(58) Field of Classification Search
CPC .............. G09G 3/3225; H01L 51/5221; H01L 51/5206; H01L 51/5036; H01L 51/56;
(Continued)

(56) References Cited

U.S. PATENT DOCUMENTS 8,334,545 B2    12/2012    Levermore et al.
2005/0200270 A1    9/2005    Kwak
(Continued)

FOREIGN PATENT DOCUMENTS

CN    1668152 A    9/2005
CN    1941385 A    4/2007
(Continued)

OTHER PUBLICATIONS

Search Report issued by the Chinese Patent Office dated Oct. 7, 2016.
(Continued)

*Primary Examiner* — Thanh T Nguyen
(74) *Attorney, Agent, or Firm* — Dilworth & Barrese, LLP.; Michael J. Musella, Esq.

(57) ABSTRACT

An OLED array substrate and a manufacturing method thereof, an array substrate and a display device are provided. The OLED array substrate includes a wire; a plurality of pixel units, each of which includes an OLED light-emitting unit, a driving transistor and a storage capacitor; an insulation layer which covers the driving transistor, the storage capacitor and the wire; and a conductive layer, which is on the insulation layer and is configured to provide a common voltage to the plurality of pixel units. At least one of the wire, the driving transistor and the storage capacitor is overlapped with the conductive layer in a direction perpendicular to the OLED array substrate.

12 Claims, 6 Drawing Sheets

(51) Int. Cl.
| | |
|---|---|
| *G09G 3/3225* | (2016.01) |
| *H01L 51/50* | (2006.01) |
| *H01L 51/52* | (2006.01) |
| *H01L 51/56* | (2006.01) |
| *G09G 3/3233* | (2016.01) |

(52) U.S. Cl.
CPC ............ *H01L 27/32* (2013.01); *H01L 27/322* (2013.01); *H01L 27/3246* (2013.01); *H01L 27/3262* (2013.01); *H01L 27/3265* (2013.01); *H01L 51/5036* (2013.01); *H01L 51/5206* (2013.01); *H01L 51/5221* (2013.01); *H01L 51/56* (2013.01); *G09G 3/3233* (2013.01); *G09G 2300/0842* (2013.01); *G09G 2320/0295* (2013.01); *G09G 2320/0693* (2013.01)

(58) Field of Classification Search
CPC . H01L 27/32; H01L 27/3262; H01L 27/3246; H01L 27/322; H01L 27/3276; H01L 21/77; H01L 27/3265
See application file for complete search history.

(56) References Cited

U.S. PATENT DOCUMENTS

| | | | |
|---|---|---|---|
| 2006/0125381 | A1 | 6/2006 | Oh |
| 2008/0017860 | A1* | 1/2008 | Kubota ............... H01L 27/3244 257/59 |
| 2012/0199871 | A1 | 8/2012 | Kubota et al. |
| 2014/0183499 | A1 | 7/2014 | Kim et al. |
| 2014/0191202 | A1 | 7/2014 | Shim |
| 2014/0362304 | A1 | 12/2014 | Wang et al. |
| 2015/0144904 | A1* | 5/2015 | Jeong .................... H01L 27/326 257/40 |

FOREIGN PATENT DOCUMENTS

| | | |
|---|---|---|
| CN | 102569348 A | 7/2012 |
| CN | 102610632 A | 7/2012 |
| CN | 102629046 A | 8/2012 |
| CN | 102881711 A | 1/2013 |
| CN | 102981336 A | 3/2013 |
| CN | 103915577 A | 7/2014 |
| CN | 104133334 A | 11/2014 |
| CN | 105789266 A | 7/2016 |
| JP | 2007148215 A | 6/2007 |
| KR | 1020060058515 A | 5/2006 |

OTHER PUBLICATIONS

International Search report dated Aug. 5, 2017.
First Chinese Office Action dated Dec. 5, 2016.
Second Chinese Office Action dated May 4, 2017.

* cited by examiner

OLED ARRAY SUBSTRATE WITH OVERLAPPED CONDUCTIVE LAYER AND MANUFACTURING METHOD THEREOF, ARRAY SUBSTRATE AND DISPLAY DEVICE

TECHNICAL FIELD

Embodiments of the present disclosure relate to an organic light-emitting diode (OLED) array substrate and a manufacturing method thereof, an array substrate and a display device.

BACKGROUND

Nowadays, one mainstream display mode of organic light-emitting diode display (OLED) device is oxide TFT (oxide thin film transistor) plus WOLED (white OLED) plus COA (color filter on array, i.e., the color filter film is formed on the array substrate). In order to solve the problem of threshold voltage (Vth) drift and luminance nonuniformity, a 3T1C external compensation technology is usually applied in the above mainstream display mode for driving pixels, and here the phrase "3T1C" means a pixel unit comprises three thin film transistors (TFT) and one storage capacitor Cst.

SUMMARY

Embodiments of the present disclosure provide an OLED array substrate and a manufacturing method thereof, an array substrate and a display device. Embodiments of the present disclosure can reduce the effective display area occupied by the common power supply lines on the OLED array substrate.

In one aspect, an embodiment of the present disclosure provides an OLED array substrate, and the OLED array substrate comprises a plurality of pixel units, each of which comprises an OLED light-emitting unit, a driving transistor and a storage capacitor; a wire; an insulation layer which covers the driving transistor, the storage capacitor and the wire; a conductive layer which is on the insulation layer and is configured to provide the common voltage to the pixel unit. At least one of the wire, the driving transistor and the storage capacitor is overlapped with the conductive layer in a direction perpendicular to the OLED array substrate.

For example, the wire comprises a detection and compensation line which is configured to connect the plurality of pixel units and a detection integrated circuit; and the conductive layer comprises a first common power supply line which is overlapped with the detection and compensation line in the direction perpendicular to the OLED array substrate.

For example, the wire comprises a gate line, and the conductive layer comprises a second common power supply line which is parallel with the gate line and is overlapped with the gate line in the direction perpendicular to the OLED array substrate.

For example, the second common power supply line is overlapped with an area that the driving transistor is located and an area that the storage capacitor is located in the direction perpendicular to the OLED array substrate.

For example, the wire comprises a data line; and the conductive line comprises a third common power supply line which is overlapped with the data line in the direction perpendicular to the OLED array substrate.

For example, the wire comprises a data line; the OLED array substrate further comprises a data line reserved pattern; and the conductive layer is connected to a source electrode of the driving transistor and the data line reserved pattern respectively through a first via hole and a second via hole which run through the insulation layer.

For example, the OLED array substrate further comprises a base substrate, and the OLED light-emitting unit comprises a first electrode, a light-emitting layer and a second electrode which are away from the substrate in base sequence; the OLED array substrate further comprises an insulation interlayer covering the conductive layer and the insulation layer in a case where the conductive layer comprises a third common power supply line; and the first electrode is disposed on the insulation interlayer.

For example, each of the plurality of pixel units further comprises a first transistor and a second transistor, and the OLED array substrate comprises a plurality of wires comprising a data line, a gate line and a detection and compensation line; a source electrode of the first transistor is electrically connected with the data line, a drain electrode of the first transistor is electrically connected with a gate electrode of the driving transistor, and a gate electrode of the first transistor is electrically connected with gate line; a source electrode of the driving transistor is electrically connected with the conductive layer, a drain electrode of the first transistor is electrically connected with an anode of the OLED light-emitting unit and a source electrode of the second transistor; one end of the storage capacitor is electrically connected with the drain electrode of the first transistor, and the other end of the storage capacitor is electrically connected with a drain electrode of the driving transistor; a cathode of the OLED light-emitting unit is grounded; a gate electrode of the second transistor is electrically connected with the detection and compensation line.

For example, the wire is a metal wire and/or the conductive layer is a metal conductive layer.

For example, the OLED array substrate comprises a display area and a surrounding area located in a periphery of the display area; the display area comprises a plurality of light-emitting areas corresponding to a plurality of OLED light-emitting units of the plurality of pixel units and a non-light-emitting area located in an area other than the plurality of light-emitting areas; and a portion of the conductive layer is at least partially located outside the plurality of light-emitting areas, which portion of the conductive layer is overlapped with at least one of the wire, the driving transistor and the storage capacitor.

In another aspect, an embodiment of the present disclosure provides manufacturing method of an OLED array substrate and the method comprises: forming a wire; forming a pixel unit, wherein the pixel unit comprises an OLED light-emitting unit, a driving transistor and a storage capacitor; forming an insulation layer which covers the pixel unit and the wire; and forming a conductive layer which is on the insulation layer and is overlapped with at least one of the wire, and the driving transistor and the storage capacitor is overlapped with the conductive layer in a direction perpendicular to the OLED array substrate, and the conductive layer is configured to provide a common voltage to the pixel unit.

For example, the wire formed comprises a data line; a data line reserved pattern is formed in a same layer as the data line; the insulation layer is formed cover the driving transistor, the storage capacitor and the wire; the conductive layer is connected with a source electrode of the driving transistor and the data line reserved pattern through a first via hole and a second via hole respectively, and the first via hole and the second via hole run through the insulation layer;

a third via hole which exposes a drain electrode of the driving transistor is formed in the insulation layer; a first electrode and the conductive layer are formed on the insulation layer and the first electrode is connected with the drain electrode of the driving transistor through the third via hole; a pixel-defining layer is formed which covers the first electrode and the conductive layer; a light-emitting layer is formed in an opening of the pixel-defining layer; and a second electrode is formed on the light-emitting layer; wherein the OLED light-emitting unit comprises the first electrode, the light-emitting layer and the second electrode.

For example, forming the first electrode and the conductive layer on the insulation layer comprises: forming the conductive layer on the insulation layer, wherein the conductive layer formed comprises a third common power supply line parallel with the data line, and the third common power supply line is overlapped with the data line in the direction perpendicular to the OLED array substrate; forming the insulation interlayer covering the conductive layer and a fourth via hole which is communicated with the third via hole is formed in the insulation interlayer; and forming the first electrode on the insulation interlayer, wherein the first electrode is connected with the drain electrode of the driving transistor through the third via hole and the fourth via hole.

For example, the wire is a metal wire and/or the conductive layer is a metal conductive layer.

In still another aspect, an embodiment of the present disclosure further provides an array substrate comprising a plurality of pixel units, and each of the plurality of pixel units comprises a light-emitting unit, and a driving transistor and a storage capacitor which are connected with the light-emitting unit; a wire, which is connected with the plurality of pixel units; an insulation layer, which covers the driving transistor, the storage capacitor and the wire; and a conductive layer, which is on the insulation layer and is configured to provide a common voltage for the pixel unit; wherein the conductive layer comprises a portion which is overlapped with at least one of the wire, the driving transistor and the storage capacitor in a direction perpendicular to the OLED array substrate.

For example, the array substrate comprises a display area and a surrounding area located in a periphery of the display area, and the display area comprises a plurality of light-emitting areas corresponding to a plurality of light-emitting units of the plurality of pixel units and a non-light-emitting area located in an area other than the plurality of light-emitting areas, and the portion of the conductive layer is located outside the non-light-emitting area.

In further still another aspect, an embodiment of the present disclosure further provides an array substrate comprising any one of the OLED array substrates mentioned above or any one of the array substrates mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

During the research, the inventors of the present disclosure noticed the pixel aperture ratio of an OLED display device is relatively small when the 3T1C external compensation technology is applied to drive the pixels in the OLED display device; and due to the reduced pixel aperture ratio, the luminous intensity of the OLED display device must be increased in order to make up for the affect caused by the reduced pixel aperture ratio upon the display of the OLED display device, and the lifetime of the OLED display device is affected as a result.

Because the sizes of the patterns in the OLED array substrate involved in the embodiments of the present disclosure are very small, the sizes of the structure patterns in the drawings of the embodiments of the present disclosure are all enlarged for the purpose of clarity. Unless otherwise specified, the drawings are not drawn in a real size or a real scale.

It should be noted that in the description of the embodiments of the present disclosure, the phrase "A is overlapped with B in a direction perpendicular to the OLED array substrate" means that A is completely overlapped with B in a direction perpendicular to the OLED array substrate, or A is partially overlapped with B in the direction perpendicular to the OLED array substrate. In addition, the direction perpendicular to the OLED array substrate means the direction perpendicular to the bearing surface of the bearing substrate included in the array substrate. It is not limited in the embodiments of the present disclosure. The former can be chosen in order to increase pixel aperture ratio better.

An embodiment of the present disclosure provides an OLED array substrate, and the OLED array substrate comprises a plurality of pixel units. Each pixel unit comprises: an OLED light-emitting unit; a driving transistor (e.g., a driving thin film transistor (TFT)) and a storage capacitor which are connected with the OLED light-emitting unit; and a wire, such as a metal wire, which is connected with the pixel units, for example, the driving transistors of the pixel units; an insulation layer, which covers the driving transistor, the storage capacitor and the wire; and a conductive layer (e.g., a metal conductive layer), which is provided on the insulation layer and is configured to provide a common voltage (VDD) to the pixel units. In the OLED array substrate, at least one of the wire, the driving transistor and the storage capacitor is overlapped with the conductive layer in the direction perpendicular to the OLED array substrate. For example, in the case where the conductive layer is overlapped with the wire, the extending direction of the portion of the conductive layer that is overlapped with the wire is approximately the same as the extending direction of the wire.

For example, the wire and/or the conductive layer can be made of a metal material, as well as a metal oxide conductive material for example, or other conductive material.

For example, the driving transistor comprises a gate electrode, an active layer, a source electrode and a drain electrode. In the case where the conductive layer is overlapped with the driving transistor, the conductive layer can be overlapped with at least one of the gate electrode, the active layer, the source electrode and the drain electrode.

Figure 9:
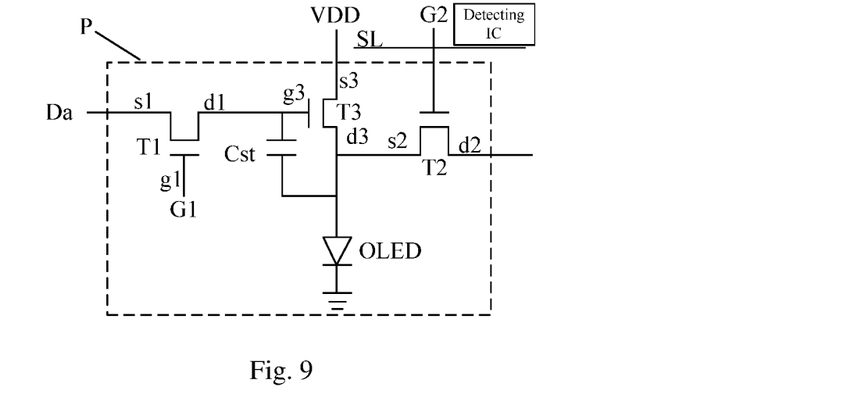
FIG. 9 is a schematic view of an external compensating circuit of a 3T1C driving pixel structure provided by an embodiment of the present disclosure.

It should be noted that the wire that is mentioned above can be, for example, at least one of a gate line, a data line, and a detection and compensation line (i.e., sense line indicated by SL in FIG. 9) which connects a pixel unit and a detection integrated circuit (i.e., Sense IC, the detecting IC in FIG. 9). For example, when the wire is a gate line, the wire can be connected with the gate electrode of the driving transistor T3; when the wire is a data line, the wire can be connected with the source electrode or the drain electrode of the driving transistor T3; when the wire is a detection and compensation line, the wire can be connected with the drain electrode of the driving transistor T3 through another transistor (see the embodiment shown in FIG. 9).

In addition, for those skilled in the art, the above mentioned OLED array substrate comprises a display area and a surrounding area located outside the display area; the display area is also referred to as AA (Active Area) area and generally used for performing display. The display area comprises a plurality of light-emitting areas corresponding to the plurality of OLED light-emitting units of the plurality of pixel units and a non-light-emitting area located in a periphery of the plurality of light-emitting areas; and the portion of the conductive layer is at least partially located outside the plurality of light-emitting areas, which portion of the conductive layer is overlapped with at least one of the wire, the driving transistor and the storage capacitor. The surrounding area can be configured for disposing a driving circuit and the like therein. The plurality of pixel units and the wire mentioned above are all disposed in the display area.

In this way, because the conductive layer configured for providing a common voltage VDD to the plurality of pixel units is disposed above the insulation layer, and is overlapped with at least one of the wire that is lightproof, the driving transistor that is lightproof and the storage capacitor that is lightproof in the direction perpendicular to the OLED array substrate, the portion of the effective display area (the light-emitting areas that all the OLED light-emitting units of the plurality of the pixel units in the display area are located) occupied by the conductive layer acting as the common power supply line on the OLED array substrate is reduced, and therefore the aperture ratio of the display device comprising the OLED array substrate is increased. Because the aperture ratio is increased, there is no need to increase the luminous intensity of the OLED display device in order to make up for the affect caused by the reduced pixel aperture ratio upon the display of the OLED display device, and the lifetime of the OLED device of an OLED display panel is increased as a result.

For example, the conductive mentioned above can be a common power supply line. The OLED substrates provided by embodiments of the present disclosure are specified as follows according to different positions of the conductive layer and different situations for the wire.

Based on any one of the embodiment mentioned above, for example, as illustrated in FIG. 1, the wire mentioned above comprises a detection and compensation line 110 which connects a pixel unit and a detection integrated circuit. For example, as illustrated in FIG. 9, a detection and compensation line SL can be connected with a pixel unit and a detection integrated circuit; the conductive layer mentioned above comprises a first common power supply line 91 which is approximately parallel with the detection and compensation line 110, and the first common power supply line 91 is overlapped with the detection and compensation line 110 in the direction perpendicular to the OLED array substrate (the detection and compensation line 110 at a lower position is indicated by the dashed line). For example, the first common power supply line 91 is located right above the detection and compensation line 110.

Because the detection and compensation line is overlapped with the first common power supply line in the direction perpendicular to the OLED array substrate, a capacitor is generated between the detection and compensation line and the first common power supply line, which increases the capacitance between the detection and compensation line and other conductive structure overlapped with the detection and compensation line and guarantees the stability of the capacitance.

Figure 1:
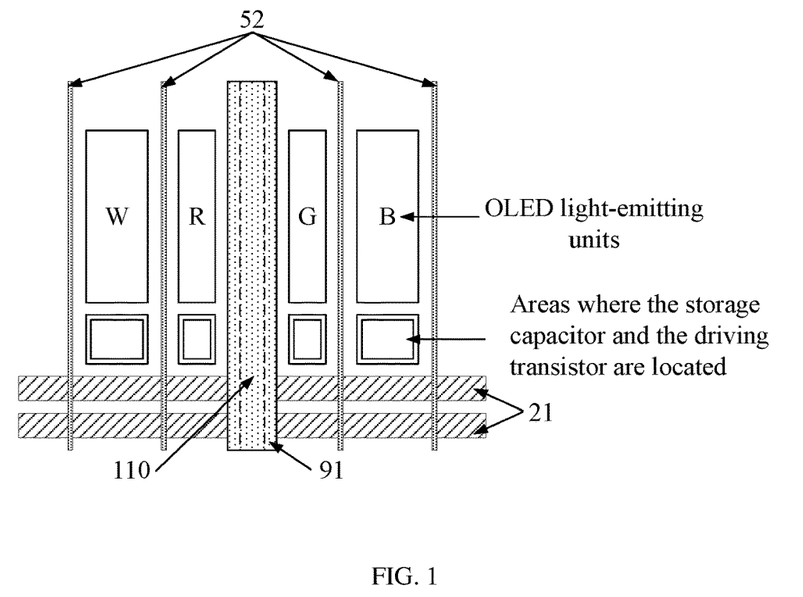
FIG. 1 a first schematic plan view of an OLED array substrate provided by an embodiment of the present disclosure.

For example, as illustrated in FIG. 1, the extending direction of the detection and compensation line 110 is approximately parallel with the extending direction of a data line 52; for example, the width of the detection and compensation line 110 is greater than the width of the data line 52.

It should be noted that four pixel units arranged in order are shown in FIG. 1, and light emitted from the areas corresponding to the OLED light-emitting units included in the four pixel units arranged in order is of different colors, which are indicated by R, G, B and W in FIG. 1, indicating the color of red, green, blue and white respectively. The colors of the light emitted from the areas that the light-emitting units are located include but are not limited to those in the embodiment illustrated by FIG. 1.

Figure 2:
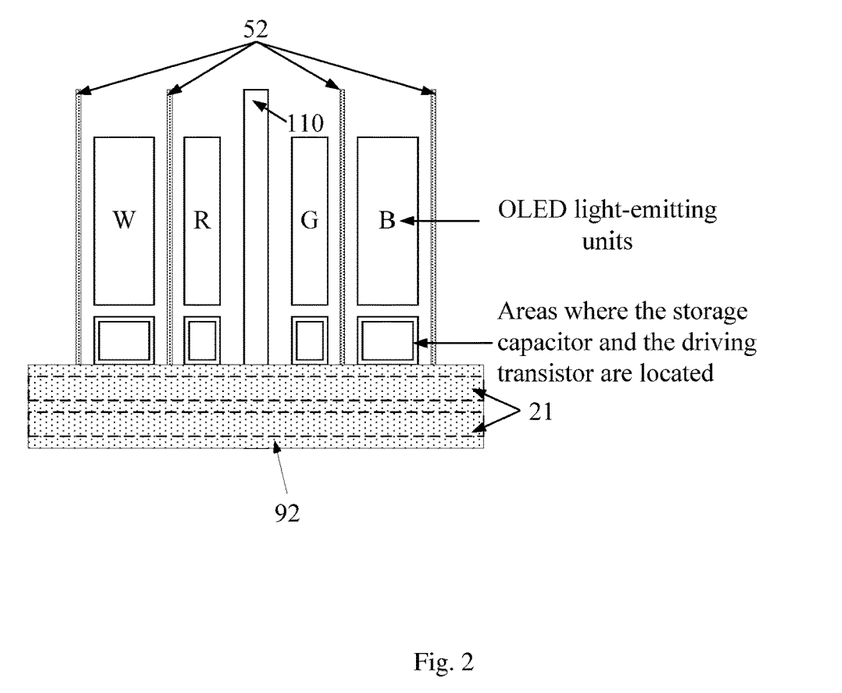
FIG. 2 is a second schematic plan view of an OLED array substrate provided by an embodiment of the present disclosure.

Based on any one of the embodiment mentioned above, for example, as illustrated in FIG. 2, the wire mentioned above comprises a gate line 21, the conductive layer mentioned above comprises a second common power supply line 92 parallel with the gate line 21, and the second common power supply line 92 is overlapped with the gate line 21 in the direction perpendicular to the OLED array substrate (the gate line 21 at a lower position is indicated by the dashed line). For example, the second common power supply line 92 is located right above the gate line 21.

In this embodiment, because the conductive layer is disposed on the insulation layer and is far away from the gate line, the risk of electro-static discharge (ESD) between the gate line and the conductive layer is reduced.

Figure 3:
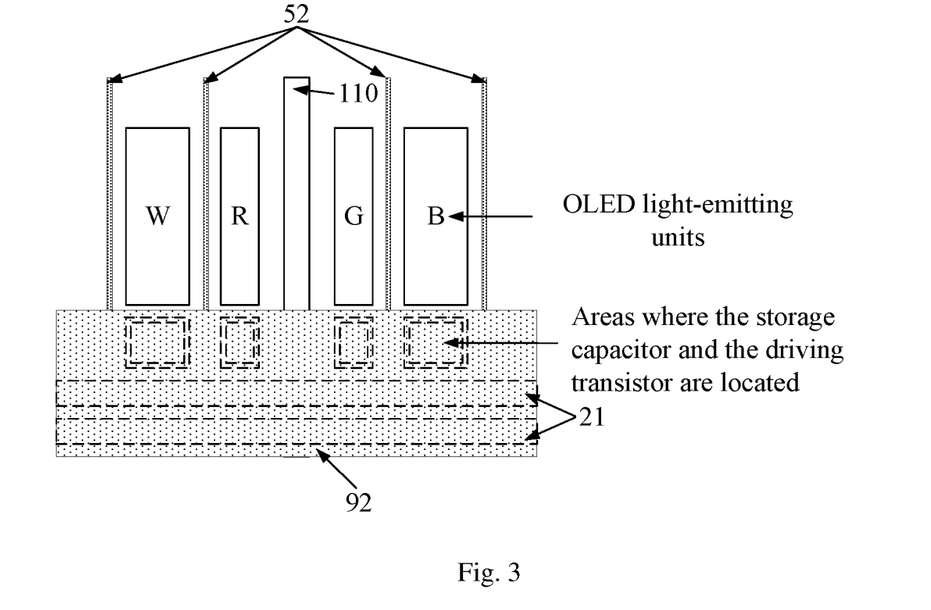
FIG. 3 is a third schematic plan view of an OLED array substrate provided by an embodiment of the present disclosure.

For example, by considering that the area that the gate line is located is close to the area that the driving transistor and the storage capacitor are located, as illustrated in FIG. 3, the second common power supply line 92 can be set wider in order to be overlapped with the area that the driving transistor and the storage capacitor are located in the direction perpendicular to the OLED array substrate. In this way, a transverse big covering area of the conductive layer is formed in the area where the gate line 21, the driving transistor and the storage capacitor are located, which makes the second common power supply line 92 have a greater width and reduces the resistance voltage drop (IR drop) of the conductive layer and the power consumption of the OLED array substrate.

Figure 4:
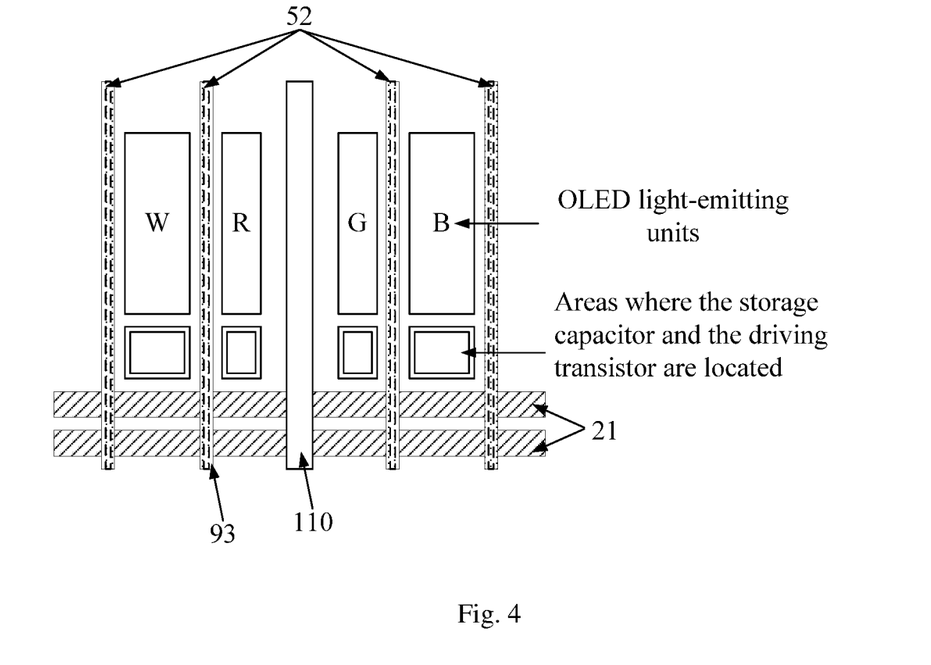
FIG. 4 is a fourth schematic plan view of an OLED array substrate provided by an embodiment of the present disclosure.

Based on any one of the embodiment mentioned above, for example, as illustrated in FIG. 4, the wire mentioned above comprises a data line 52, the conductive layer mentioned above comprises a third common power supply line 93 parallel with the data line 52, and the third common power supply line 93 is overlapped with the data line 52 in the direction perpendicular to the OLED array substrate (the data line 52 at a lower position is indicated by the dashed line). For example, the third common power supply line 93 is located right above the data line 52.

Figure 5:
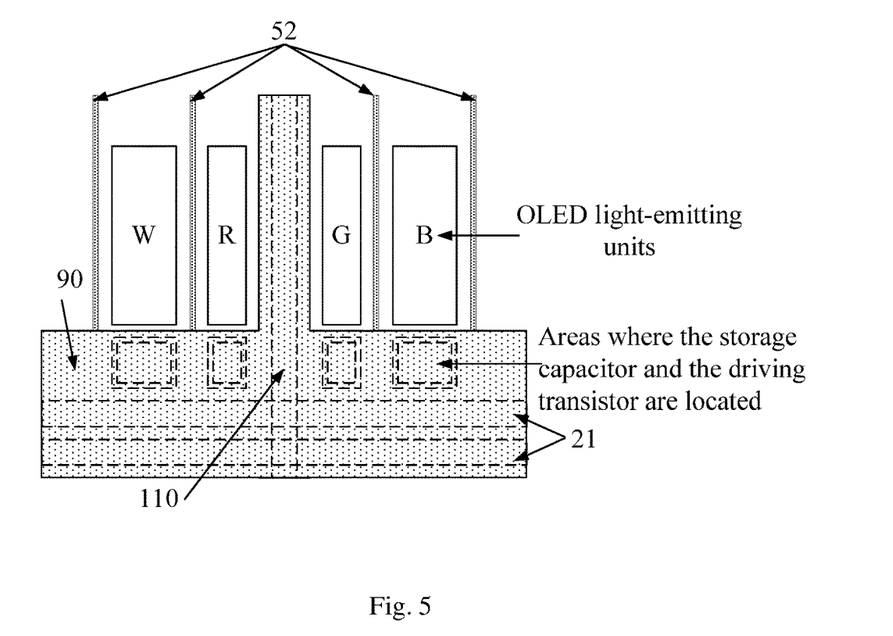
FIG. 5 is a fifth schematic plan view of an OLED array substrate provided by an embodiment of the present disclosure.
Figure 6:
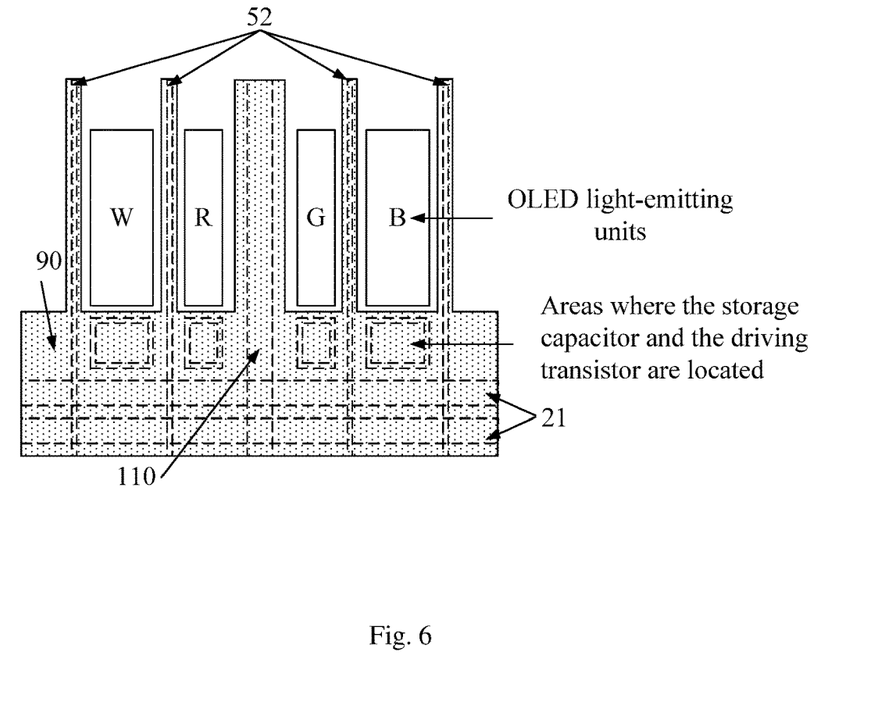
FIG. 6 is a sixth schematic plan view of an OLED array substrate provided by an embodiment of the present disclosure.

It should be noted that FIG. 1 to FIG. 4 only show the case that a conductive layer comprises one of the first common power supply line 91, the second common power supply line 92, and the third common power supply line 93 respectively, which is not limited to the embodiments of the present disclosure. For example, as illustrated in FIG. 5, the conductive layer mentioned above may comprise both the first common power supply line and the second common power supply line mentioned above, and the first common power supply line and the second common power supply line can be connected with each other to form an integrated structure; or as illustrated in FIG. 6, the conductive layer mentioned above may comprise all the first common power supply line, the second common power supply line and the third common power supply line mentioned above, and the first common power supply line, the second common power supply line and the third common power supply line can be connected with one another to form an integrated structure, so that the area of the conductive layer can be larger and the resistance voltage drop (IR drop) of the conductive layer can be smaller.

Figure 7:
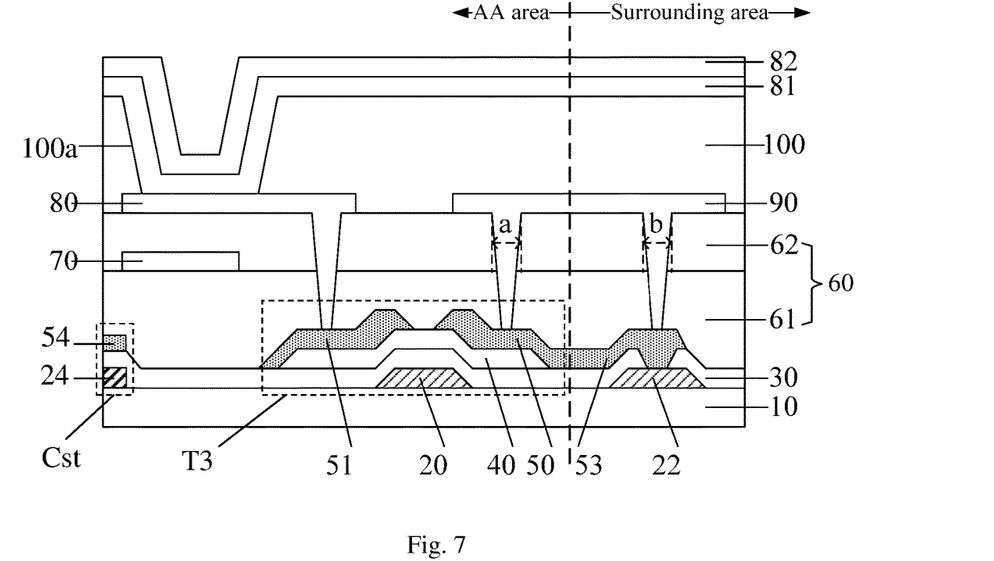
FIG. 7 is a first cross sectional view of an OLED array substrate provided by an embodiment of the present disclosure.

For example, as illustrated in FIG. 7, the OLED array substrate further comprises a data line reserved pattern 53 which is disposed in the same layer as the data line. For example, the data line reserved pattern 53 is connected with the source electrode 50 of the driving transistor T3 (e.g., a driving TFT) (e.g., the two are formed in an integrated structure), and is connected with a data line lead 22 (for example, the data line lead 22 is disposed in the same layer as the gate electrode 20 of the driving transistor T3) through a via hole running through the insulator layer 30. The data line is configured to transmit data voltage signals for the OLED light-emitting unit, the data line reserved pattern 53 is configured to transfer and to connect the data line and the data line lead 22, and the data line lead 22 is configured to connect a source driver (e.g., a source drive IC) and the data line reserved pattern 53 so as to connect the source driver and the data line. The conductive layer 90 is connected with the source electrode 50 of the driving transistor T3 and the data line reserved pattern 53 through a first via hole (indicated as "a" in the drawings) and a second via hole (indicated as "b" in the drawings) running through the insulation layer 60 respectively. The data line reserved pattern 53 mentioned above is usually located in a periphery which is outside the display area (indicated as AA area, meaning an Active Area).

It should be noted that the stacked structures in FIG. 7 are as follows in order: the substrate 10→the gate electrode 20 of the driving transistor T3, the gate line, and the data line lead 22 which is disposed in the same layer as the gate electrode→the gate insulation layer 30→the active layer 40 of the driving transistor T3→the source electrode 50 and the drain electrode 51 of the driving transistor T3, the data line, and the data line reserved pattern 53 which is disposed in the same layer as the data line→the protective layer 61→the color filter layer 70→the planarization layer 62→the first electrode 80 of the light-emitting unit and the conductive layer 90 (for example, the first electrode 80 and the conductive layer 90 are disposed side-by-side on the planarization layer 62)→the pixel-defining layer 100→the light-emitting layer 81 of the OLED light-emitting unit→the second electrode 82 of the OLED light-emitting unit.

For example, at least one of the gate electrode 20, the active layer 40, the source electrode 50 and the drain electrode 51 of the driving transistor T3 comprises a portion that is not overlapped with the block first electrode 80 of the OLED light-emitting unit in the direction perpendicular to the substrate 10.

For example, the OLED array substrate comprises the pixel-defining layer 100 and the opening 100a of the pixel-defining layer 100 exposes at least a portion of the surface of the first electrode 80 of the OLED light-emitting unit. Each of the light-emitting layer 81 and the second electrode 82 of the OLED light-emitting unit comprises a portion which is in the opening 100a.

For example, the top electrode 54 of the storage capacitor Cst can be, for example, disposed in the same layer as the source electrode 50 and the drain electrode 51 of the driving transistor T3, and the bottom electrode 24 of the storage capacitor Cst can be disposed in the same layer as the gate electrode 20 of the driving transistor T3. For example, each of the top electrode 54 and the bottom electrode 24 of the storage capacitor Cst comprises a portion which is not overlapped with the first electrode 80 of the OLED light-emitting unit in the direction perpendicular to the substrate 10.

In the embodiment, because the current mainstream OLED array substrates are COA substrates which are integrated with color filters, therefore the stacked structures as illustrated in FIG. 7 may further comprise a color filter 70. For example, the color filter 70 is overlapped with the first electrode 80 of the OLED light-emitting unit in the direction perpendicular to the substrate 10. In this case, the insulation layer 60 mentioned above may comprise the protective layer 61 (usually called as PSA layer for short) covering the driving transistor T3 and the planarization layer 62 (usually called for short as OC layer, i.e., Overcoat layer) on the protective layer 61 and covering the color filter 70, and for example the insulation layer 60 consists of these two layers, so that the first via hole and the second via hole mentioned above both run through these two layers.

Figure 8:
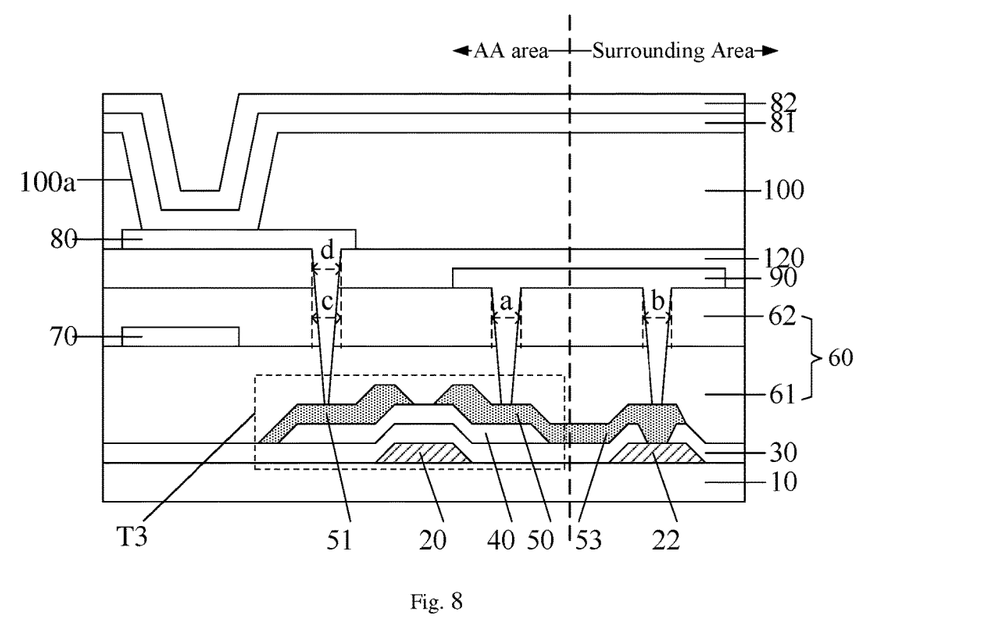
FIG. 8 is a second cross sectional view of an OLED array substrate provided by an embodiment of the present disclosure.

For example, in a case that the conductive layer mentioned above comprises a third common power supply line, as illustrated in FIG. 8, the OLED array substrate further comprises an insulation interlayer 120 which covers the conductive layer 90 and the insulation layer 60, and the first electrode 80 of the OLED light-emitting unit is disposed on the insulation interlayer 120.

In the embodiment, because the third common power supply line is disposed above the data line and is overlapped with the data line, the insulation interlayer 120 mentioned above is further disposed between the conductive layer and the insulation layer in the embodiment of the present disclosure in order to guarantee that a short circuit will not occur between the first electrode 80 (i.e., the pixel electrode which can be made of ITO for example) of the OLED light-emitting unit and the conductive layer 90. In this way, the distance between the conductive layer 90 and the first electrode 80 can be shorten to increase the aperture ratio to a further degree, so that the resistance voltage drop of the conductive layer can be reduced and the aperture ratio can also be increased to a further degree.

For example, as can be seen from FIG. 9, the pixel unit further comprises a first transistor T1 and a second transistor T2; the wire comprises a data line Da, a gate line G1 and a detection and compensation line G2; a source electrode s1 of the first transistor T1 is electrically connected with the data line Da, a drain electrode d1 of the first transistor T1 is electrically connected with the gate electrode g3 of the driving transistor T3, a gate electrode g1 of the first transistor T1 is electrically connected with the gate line G1; the source electrode s3 of the driving transistor T3 is electrically connected with the conductive layer (see VDD in FIG. 9), and the drain electrode d3 of the driving transistor T3 is electrically connected with the anode (an example of the first electrode 80) of the OLED light-emitting unit and a source electrode s2 of the second transistor T2; one end of the storage capacitor Cst is electrically connected with the drain electrode of the first transistor T1 and the other end of the storage capacitor Cst is electrically connected with the drain electrode g3 of the driving transistor T3; the cathode (an example of the second electrode 82) of the OLED light-emitting unit is grounded; a gate electrode g2 of the second transistor T2 is electrically connected with the detection and compensation line G2. In this way, a 3T1C external compensation configuration is obtained, which can solve the problem of threshold voltage (Vth) drift and luminance nonuniformity of the oxide TFT.

For example, an embodiment of the present disclosure further comprises a manufacturing method of the OLED array substrate mentioned above and the method comprises steps of: forming a wire and a plurality of pixel units, wherein the formed pixel unit comprises an OLED light-emitting unit, a driving transistor and a storage capacitor; forming an insulation layer which covers the pixel unit and the wire. The method mentioned above further comprises: forming a conductive layer which is on the insulation layer and is overlapped with at least one of the wire, the driving transistor and the storage capacitor in the direction perpendicular to the OLED array substrate, and the conductive layer is configured to provide a common voltage to the pixel unit.

For example, the wire is a metal wire and/or the conductive layer is a metal conductive layer.

Taking the OLED array substrate as illustrated in FIG. 8 as an example, for example, the method mentioned above comprises: forming the driving transistor T3, the storage capacitor, and the wire on the base substrate 10, the formed wire including the data line; forming the data line reserved pattern 53 which is disposed in the same layer as the data line; forming the insulation layer 60 which covers the driving transistor T3, the storage capacitor and the wire, and forming the third via hole c which exposes the drain electrode 51 of the driving transistor T3 in the insulation layer 60; forming the first electrode 80 and the conductive layer 90 which is configured to provide a common voltage to the pixel unit on the insulation layer 60, allowing the conductive layer 90 to be overlapped with at least one of the wire, the driving transistor T3, and the storage capacitor in the direction perpendicular to the OLED array substrate and connected with the source electrode 50 of the driving transistor T3 and the data line reserved pattern 53 respectively through the first via hole a and the second via hole b that run through the insulation layer 60, and allowing the first electrode 80 to be connected with the drain electrode 51 of the driving transistor T3 through the third via hole c; forming the pixel-defining layer 100 which covers the first electrode 80 and the conductive layer 90; forming the light-emitting layer 81 in the opening 100a of the pixel-defining layer 100; and forming the second electrode 82 on the light-emitting layer 81. In the embodiment, the first electrode 80, the light-emitting layer 81 and the second electrode 82 form the OLED light-emitting unit, and the OLED light-emitting unit, the driving transistor and the storage capacitor form the pixel unit.

For example, the top electrode 54 of the storage capacitor Cst can be, for example, disposed in the same layer as the source electrode 50 and the drain electrode 51 of the driving transistor T3, and the bottom electrode 24 of the storage capacitor Cst can be disposed in the same layer as the gate electrode 20 of the driving transistor T3.

Figure 10:
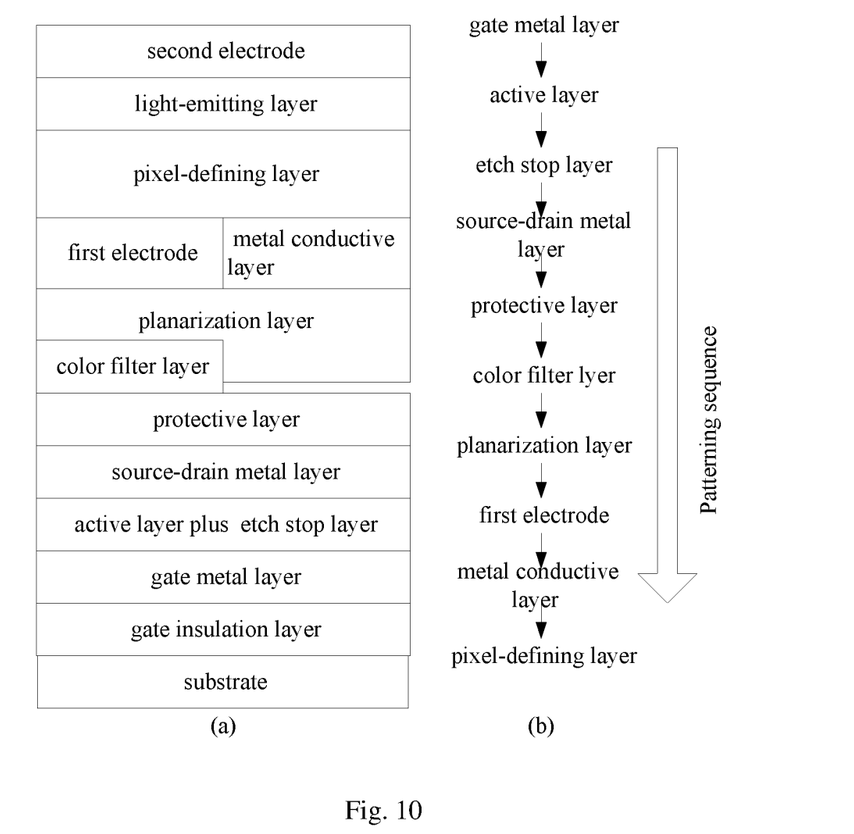
FIG. 10 is a first flowchart of a manufacturing method of an OLED array substrate provided by an embodiment of the present disclosure.

For example, because the current mainstream OLED array substrates are COA substrates which are integrated with color filters, in this case, the insulation layer 60 mentioned above may comprise the protective layer 61 (usually called as PSA layer for short) covering the driving transistor T3 and the planarization layer 62 (usually called for short as OC layer, i.e., Overcoat layer) which is on the protective layer 61 and covers the color filter 70, and therefore the steps of the method mentioned above are illustrated in FIG. 10(a) for example, comprising: forming in order on the substrate the gate metal layer comprising the gate electrode, the gate line, the data line lead which is disposed in the same layer as the gate electrode→the gate insulation layer→the active layer→the etch stop layer (here, the step of forming the etch stop layer can be omitted when the material of the active layer is not susceptible to etching for the source-drain electrode, details can be referred to the art of state and is not limited to embodiments of the present disclosure)→the source-drain metal layer comprising the source electrode, the drain electrode, the data line, and the data line reserved pattern which is disposed in the same layer as the data line→the protective layer→the color filter layer→the planarization layer→the first electrode of the OLED light-emitting unit and the conductive layer→the pixel-defining layer→the light-emitting layer of the OLED light-emitting unit→the second electrode of the OLED light-emitting unit. In this stacked structure, for example, as can be seen from FIG. 10(b), the gate metal layer, the active layer, the etch stop layer, the source-drain metal layer, the protective layer, the color filter layer, the planarization layer, the first electrode, the metal conductive layer and the pixel-defining layer can all be formed with a patterning process, which may be a photolithography process comprising exposing, developing, etching and the like, or other process that can used to form needed patterns in the related art field.

For example, based on any one of the embodiment mentioned above, the step of forming the first electrode and the conductive layer on the insulation layer comprises: forming on the insulation layer the conductive layer comprising the third common power supply line which is approximately parallel with the data line and is overlapped with the data line in the direction perpendicular to the OLED array substrate; as illustrated in FIG. 8, forming the insulation interlayer 120 covering the conductive layer 90 and the fourth via hole (indicated as d in the drawing) in the insulation interlayer 120 and communicated with the third via hole (indicated as c in the drawing); forming on the insulation interlayer 120 the first electrode 80, which is connected with the drain electrode 51 of the driving transistor T3 through the third via hole c and the fourth via hole d.

Because the third common power supply line is disposed on the data line and is overlapped with the data line, the insulation interlayer mentioned above is further disposed between the conductive layer and the insulation layer in the embodiment of the present disclosure in order to guarantee that a short circuit will not occur between the first electrode (i.e., the pixel electrode which can be made of ITO for example) of the OLED light-emitting unit and the conductive layer. In this way, the distance between the conductive layer 90 and the first electrode 80 can be shorten to further increase the aperture ratio, so that the resistance voltage drop of the conductive layer can be reduced and the aperture ratio can also be increased to a further degree.

Figure 11:
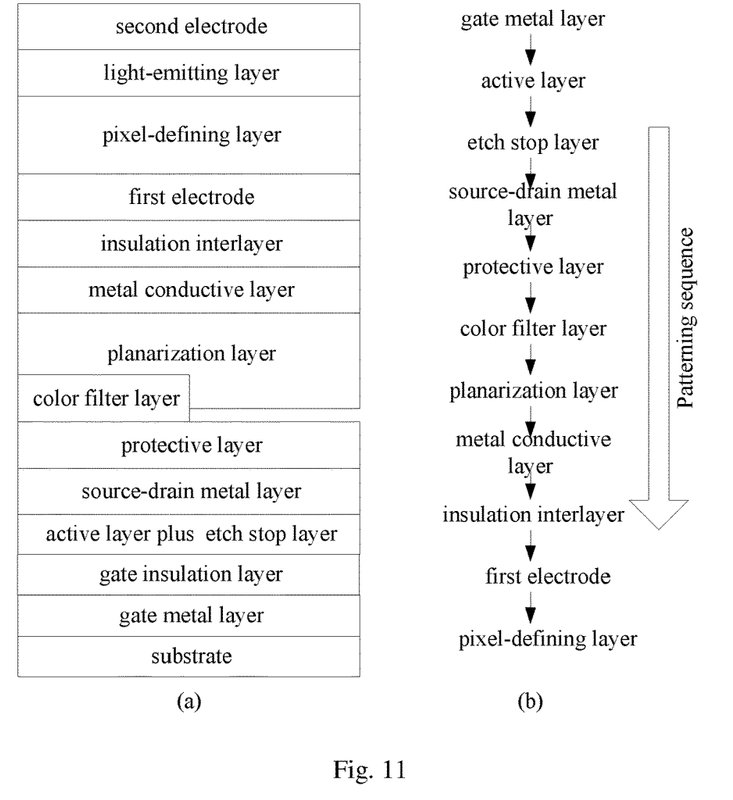
FIG. 11 is a second flowchart of a manufacturing method of an OLED array substrate provided by an embodiment of the present disclosure.

For example, in a case that the operation of forming the insulation interlayer 120 is comprised, the method mentioned above are illustrated in FIG. 11(a) for example, comprising: forming in order on the substrate the gate metal layer comprising the gate electrode, the gate line, the data line lead which is disposed in the same layer as the gate electrode→the gate insulation layer→the active layer→the etch stop layer (here, the step of forming the etch stop layer can be omitted when the material of the active layer is not susceptible to etching for the source-drain electrode, details can be referred to the art of state and is not limited to embodiments of the present disclosure)→the source-drain metal layer comprising the source electrode, the drain electrode, the data line and the data line reserved pattern which is disposed in the same layer as the data line→the protective layer→the color filter layer→the planarization layer→the conductive layer→the insulation interlayer—the first electrode of the OLED light-emitting unit→the pixel-defining layer→the light-emitting layer of the OLED light-emitting unit→the second electrode of the OLED light-emitting unit. In this stacked structure, for example, as can be seen from FIG. 11(b), the gate metal layer, the active layer, the etch stop layer, the source-drain metal layer, the protective layer, the color filter layer, the planarization layer, the metal conductive layer, the insulation interlayer, the first electrode and the pixel-defining layer can all be formed with a patterning process.

Figure 12:
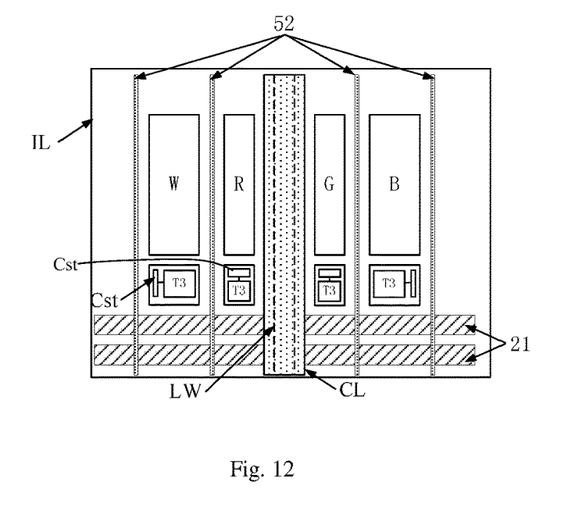
FIG. 12 is a schematic top view of an array substrate provided by an embodiment of the present disclosure.

At least one embodiment of the present disclosure further provides another array substrate, and as illustrated in FIG. 12, the array substrate comprises a plurality of pixel units and each pixel unit comprises a light-emitting unit (indicated with R, G, B, W in FIG. 12), a driving transistor T3 and a storage capacitor Cst which are connected with the light-emitting unit; and a wire LW (indicated by the dashed line), which is connected with the pixel unit P (for example, connected with the driving transistors of the pixel unit); an insulation layer IL, which covers the driving transistor T3, the storage capacitor Cst and the wire LW; and a conductive layer CL, which is on the insulation layer IL and is configured to provide a common voltage to the pixel unit. The conductive layer CL comprises a portion which is overlapped with at least one of the wire LW, the driving transistor T3 and the storage capacitor Cst in the direction perpendicular to the array substrate. That the conductive layer CL is overlapped with the wire LW is illustrated in FIG. 12 for example.

For example, the array substrate comprises a display area (the structure as illustrated in FIG. 12 is located in the display area of the array substrate) and a surrounding area located in a periphery of the display area (not shown in FIG. 12). The display area comprises a plurality of light-emitting areas (areas indicated by R, G, B and W) corresponding to a plurality of OLED light-emitting units of the plurality of pixel units and a non-light-emitting area located in an area other than the plurality of light-emitting areas. The overlapping potion of the conductive layer is located in the non-light-emitting area.

For example, the wire LW can be a gate line, a data line or a detection and compensation line. For example, when the wire LW is a gate line, the wire LW can be connected with the gate electrode of the driving transistor T3; when the wire LW is a data line, the wire LW can be connected with the source electrode or the drain electrode of the driving transistor T3; when the wire LW is a detection and compensation line, the wire LW can be connected with the drain electrode of the driving transistor T3 by way of another transistor (see the embodiment as illustrated in FIG. 9).

For example, the light-emitting unit can be OLED (organic light-emitting diode), LED (light-emitting diode), or other types of active light-emitting devices.

For example, the array substrate can be an OLED array substrate, or an LED array substrate or other types of active light-emitting array substrates.

Based on any one of the embodiment mentioned above, an embodiment of the present disclosure further provide a display device comprising any one of the OLED array substrates or array substrates.

For example, the display device mentioned above can be an OLED display device, an OLED television, a digital photo frame, a mobile phone, a tablet computer or a product or a component which possesses any display function.

The embodiments for the OLED array substrate and the embodiments for the manufacturing method thereof and the embodiments for the display device above can be combined for cross reference.

In embodiments of the present disclosure, because the conductive layer configured for providing a common voltage VDD to the plurality of pixel units is disposed above the insulation layer, and is overlapped with at least one of the wire that is lightproof, the driving transistor that is lightproof and the storage capacitor that is lightproof in the direction perpendicular to the OLED array substrate, the portion of the effective display area occupied by the conductive layer acting as the common power supply lines on the OLED array substrate is reduced, and therefore the aperture ratio is increased. Because the aperture ratio is increased, there is no need to increase the luminous intensity of the OLED display device in order to make up for the affect caused by the reduced aperture ratio upon the display of the OLED display device, and the lifetime of the OLED device is increased as a result.

What are described above is related to the illustrative embodiments of the disclosure only and not limitative to the scope of the disclosure; the scopes of the disclosure are defined by the accompanying claims.

The application claims priority to the Chinese patent application No. 201610371658.2, filed May 30, 2016, the entire disclosure of which is incorporated herein by reference as part of the present application.

What is claimed is:

1. An OLED array substrate, comprising:
    a plurality of pixel units, wherein each of the plurality of pixel units comprises an. OLED light-emitting unit, a driving transistor and a storage capacitor;
    a wire;
    an insulation layer which covers the driving transistor, the storage capacitor and the wire; and
    a conductive layer, which is on the insulation layer and is configured to provide a common voltage to the plurality of the pixel units;
    wherein at least one of the wire, the driving transistor and the storage capacitor is overlapped with the conductive layer in a direction perpendicular to the OLED array substrate;
    the wire comprises a detection and compensation line which is configured to connect the plurality of pixel units and a detection integrated circuit, and the conductive layer comprises a first common power supply line which is overlapped with the detection and compensation line in the direction perpendicular to the OLED array substrate;
    the wire comprises a gate line, and the conductive layer comprises a second common power supply line which is parallel with the gate line and is overlapped with the gate line in the direction perpendicular to the OLED array substrate; and
    the first common power supply line is overlapped with the second common power supply line in the direction perpendicular to the OLED array substrate.

2. The OLED array substrate according to claim 1, wherein the second common power supply line is further overlapped with an area that the driving transistor is located and an area that the storage capacitor is located in the direction perpendicular to the OLED array substrate.

3. The OLED array substrate according to claim 1, wherein the wire comprises a data line; and
    the conductive line comprises a third common power supply line which is overlapped with the data line in the direction perpendicular to the OLED array substrate.

4. The OLED array substrate according to claim 1, wherein the wire comprises a data line;
    the OLED array substrate further comprises a data line reserved pattern; and
    the conductive layer is connected to a source electrode of the driving transistor and the data line reserved pattern respectively through a first via hole and a second via hole which run through the insulation layer.

5. The OLED array substrate according to claim 4, further comprising a base substrate, wherein the OLED light-emitting unit comprises a first electrode, a light-emitting layer and a second electrode which are away from the base substrate in sequence;
    the OLED array substrate further comprises an insulation interlayer covering the conductive layer and the insulation layer in a case where the conductive layer comprises a third common power supply line; and the first electrode is disposed on the insulation interlayer.

6. The OLED array substrate according to claim 1, wherein each of the plurality of pixel units further comprises a first transistor and a second transistor, and
    the OLED array substrate comprises a plurality of wires comprising a data line, a gate line and a detection and compensation line;
    a source electrode of the first transistor is electrically connected with the data line, a drain electrode of the first transistor is electrically connected with a gate electrode of the driving transistor, and a gate electrode of the first transistor is electrically connected with gate line;
    a source electrode of the driving transistor is electrically connected with the conductive layer, a drain electrode of the first transistor is electrically connected with an anode of the MED light-emitting unit and a source electrode of the second transistor;
    one end of the storage capacitor is electrically connected with the drain electrode of the first transistor, and the other end of the storage capacitor is electrically connected with a drain electrode of the driving transistor;
    a cathode of the OLED light-emitting unit is grounded; and
    a gate electrode of the second transistor is electrically connected with e detection and compensation line.

7. The OLED array substrate according to claim 1, wherein the wire is a metal wire and/or the conductive layer is a metal conductive layer.

8. The OLED array substrate according to claim 1, wherein the OLED array substrate comprises a display area and a surrounding area located in a periphery of the display area;
    the display area comprises a plurality of light-emitting areas corresponding to a plurality of OLED light-emitting units of the plurality of pixel units and a non-light-emitting area located in an area other than the plurality of light-emitting areas; and
    a portion of the conductive layer is at least partially located outside the plurality of light-emitting areas, which portion of the conductive layer is overlapped with at least one of the wire, the driving transistor and the storage capacitor.

9. A display device, comprising the OLED array substrate according to claim 1.

10. An array substrate, comprising:
a plurality of pixel units, wherein each of the plurality of pixel units comprises a light-emitting unit, and a driving transistor and a storage capacitor which are connected with the light-emitting unit;
a wire, which is connected with the plurality of pixel units;
an insulation layer, which covers the driving transistor, the storage capacitor and the wire; and
a conductive layer, which is on the insulation layer and is configured to provide a common voltage for the pixel unit;
wherein the conductive layer comprises a portion which is overlapped with at least one of the wire, the driving transistor and the storage capacitor in a direction perpendicular to the array substrate;
the wire comprises a detection and compensation line which is configured to connect the plurality of pixel units and a detection integrated circuit, and the conductive layer comprises a first common power supply line which is overlapped with the detection and compensation line in the direction perpendicular to the array substrate;
the wire comprises a gate line, and the conductive layer comprises a second common power supply line which is parallel with the gate line and is overlapped with the gate line in the direction perpendicular to the array substrate; and
the first common power supply line is overlapped with the second common power supply line in the direction perpendicular to the array substrate.

11. The array substrate according to claim 10, comprising a display area and a surrounding area located in a periphery of the display area,
wherein the display area comprises a plurality of light-emitting areas corresponding to a plurality of light-emitting units of the plurality of pixel units and a non-light-emitting area located in an area other than the plurality of light-emitting areas, and the portion of the conductive layer is located outside the non-light-emitting area.

12. A display device, comprising the OLED array substrate according to claim 10.

* * * * *